(12) United States Patent
Cho

(10) Patent No.: US 8,324,979 B2
(45) Date of Patent: Dec. 4, 2012

(54) COUPLED MICROSTRIP LINES WITH GROUND PLANES HAVING GROUND STRIP SHIELDS AND GROUND CONDUCTOR EXTENSIONS

(75) Inventor: Shu-Ying Cho, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 279 days.

(21) Appl. No.: 12/617,482

(22) Filed: Nov. 12, 2009

(65) Prior Publication Data

US 2010/0214041 A1    Aug. 26, 2010

Related U.S. Application Data

(60) Provisional application No. 61/155,411, filed on Feb. 25, 2009.

(51) Int. Cl.
*H01P 3/08* (2006.01)
(52) U.S. Cl. .................. 333/4; 333/5; 333/33; 333/238
(58) Field of Classification Search .................. 333/4, 5, 333/33, 238
See application file for complete search history.

(56) References Cited

U.S. PATENT DOCUMENTS

| | | | |
|---|---|---|---|
| 3,925,740 A | 12/1975 | Steensma | |
| 4,340,873 A | 7/1982 | Bastida | |
| 4,855,537 A | 8/1989 | Nakai et al. | |
| 4,992,851 A | 2/1991 | Platzoeder et al. | |
| 5,313,175 A | 5/1994 | Bahl et al. | |
| 5,753,968 A | 5/1998 | Bahl et al. | |
| 5,841,333 A | 11/1998 | Fishburn et al. | |
| 6,060,383 A | 5/2000 | Nogami et al. | |
| 6,373,740 B1 | 4/2002 | Forbes et al. | |
| 6,465,367 B1 | 10/2002 | Tsai | |
| 6,624,729 B2 | 9/2003 | Wright et al. | |
| 6,864,757 B2 | 3/2005 | du Toit et al. | |
| 6,950,590 B2 | 9/2005 | Cheung et al. | |
| 7,081,648 B2 | 7/2006 | Tsai | |
| 7,102,456 B2 | 9/2006 | Berg | |
| 7,202,758 B2 * | 4/2007 | Hsu ................................. 333/33 |
| 7,242,272 B2 | 7/2007 | Ham et al. | |
| 7,305,223 B2 | 12/2007 | Liu et al. | |
| 2004/0017270 A1 | 1/2004 | Nagra et al. | |

(Continued)

OTHER PUBLICATIONS

Pozar, David M., "Microwave Engineering," 1990, pp. 383-384, Addison-Wesley, Reading, Massachusetts.

*Primary Examiner* — Benny Lee
(74) *Attorney, Agent, or Firm* — Haynes and Boone, LLP

(57) ABSTRACT

A coupled microstrip line structure having tunable characteristic impedance and wavelength are provided. In accordance with one aspect of the invention, a coupled microstrip line structure comprises a first ground plane having a plurality of first conductive strips separated by a dielectric material, and a first dielectric layer over the first ground plane. The coupled microstrip line further comprises a first signal line over the first dielectric layer, wherein the first signal line is directly above the plurality of first conductive strips, and wherein the first signal line and the plurality of first conductive strips are non-parallel, and a second signal line over the first dielectric layer, wherein the second signal line is directly above the plurality of first conductive strips, and wherein the second signal line and the plurality of first conductive strips are non-parallel, and wherein the second signal line is substantially parallel to the first signal line.

19 Claims, 8 Drawing Sheets

U.S. PATENT DOCUMENTS

| | | |
|---|---|---|
| 2005/0040915 A1 | 2/2005 | Ryu et al. |
| 2005/0083152 A1 | 4/2005 | Hsu et al. |
| 2007/0241844 A1* | 10/2007 | Kim et al. .................... 333/238 |
| 2009/0195327 A1 | 8/2009 | Cho et al. |
| 2009/0302976 A1 | 12/2009 | Cho |
| 2009/0315633 A1* | 12/2009 | Ding et al. ..................... 333/1 |
| 2010/0141354 A1 | 6/2010 | Cho |

* cited by examiner

COUPLED MICROSTRIP LINES WITH GROUND PLANES HAVING GROUND STRIP SHIELDS AND GROUND CONDUCTOR EXTENSIONS

This application claims the benefit of U.S. Provisional Application Ser. No. 61/155,411, filed on Feb. 25, 2009, entitled "Coupled Microstrip Lines with Tunable Characteristic Impedance and Wavelength," which application is hereby incorporated herein by reference.

TECHNICAL FIELD

This invention relates generally to microstrip line structures and, more particularly, to coupled microstrip line structures having tunable characteristic impedances and tunable characteristic wavelengths.

BACKGROUND

Transmission lines are important elements in microwave circuit applications. These devices provide the interconnection between active and passive devices of microwave circuits, and are also utilized as impedance matching elements. A microstrip line is a type of transmission line widely utilized in monolithic microwave integrated circuit (MMIC) applications.

Microstrip lines have a number of advantages when utilized in MMIC applications. First of all, since microstrip lines are formed of conductive planes disposed on substrates, these devices are readily adaptable to the manufacturing process of the integrated circuits. Accordingly, microstrip lines may be integrated on the same substrate as commonly used integrated circuits such as complementary metal-oxide-semiconductor (CMOS) circuits.

Generally, microstrip lines comprise a signal line over a ground plane, which is a solid metal plane, with a dielectric layer or layers separating the signal line from the ground plane. The ground plane has the advantageous feature of isolating the signal line from the substrate, hence any substrate-induced losses are reduced. However, the formation of the ground plane also incurs drawbacks. As the scaling of backend processes continues to trend downward, the vertical distance between the signal line and the ground plane becomes significantly smaller; this requires the signal line to be increasingly narrower in order to achieve the desired characteristic impedance. Consequently, ohmic losses in microstrip lines become increasingly more significant, and demand better impedance matching between microstrip lines and network devices. Furthermore, the ground plane becomes a barrier for tuning the characteristic impedance of microstrip lines; this is due to the limited vertical distance between the signal line and the ground plane, a small distance with little room for tuning.

In addition, microstrip lines typically occupy a large chip area. For example, the electro-magnetic wavelength in $SiO_2$ dielectric material is about 3000 μm at 50 GHz. Accordingly, microstrip lines have a requirement that the length of the microstrip line be at least a quarter of the wavelength, here about 750 μm, in order to match network impedance. This is considered to be area-consuming. With the increasing downscaling of integrated circuits, the chip-area requirement of the microstrip lines becomes a bottleneck that prevents the integration of microwave devices and integrated circuits adopting CMOS devices.

Unfortunately, the microstrip line structure also has limited application in radio frequency (RF) circuits, particularly in microwave and millimeter wave integrated RF circuits like those in GPS satellite systems, PDA cell phones and ultra-wideband (UWB) wireless communication systems. In order to complement the gain-bandwidth of silicon transistors, microwave applications require passive devices with a low parasitic loss that can be isolated from other circuit sub-blocks. The parasitic loss of RF on-chip components cannot be scaled as readily as the parasitic loss that accompanies active devices such as transistors.

Additionally, to implement many RF circuit designs it is necessary to use four port components, a four terminal device wherein an input into any one terminal will appear on the other three. A single signal line microstrip transmission line can only accommodate two-port components, a two terminal device with an input terminal and an output terminal. Accordingly, what is needed in the art are mechanisms that overcome the deficiencies of the prior art.

SUMMARY OF THE INVENTION

In accordance with one aspect of the present invention, a coupled microstrip line structure comprises a first ground plane having a plurality of first conductive strips separated by a dielectric material, and a first dielectric layer over the first ground plane. The coupled microstrip line structure further comprises a first signal line over the first dielectric layer, wherein the first signal line is directly above the plurality of first conductive strips, and wherein the first signal line and the plurality of first conductive strips are non-parallel, and a second signal line over the first dielectric layer, wherein the second signal line is directly above the plurality of first conductive strips, and wherein the second signal line and the plurality of first conductive strips are non-parallel, and wherein the second signal line is substantially parallel to the first signal line.

In accordance with another aspect of the present invention, a coupled microstrip line structure comprising a substrate, a first ground plane over the substrate, wherein the first ground plane is conductive and comprises a plurality of first ground strip shields substantially parallel to each other, and a first and second ground conductor electrically coupled to the plurality of first ground strip shields, wherein the first and second ground conductors are substantially parallel to each other is provided. The coupled microstrip line structure further comprises one or more dielectric layers over the first ground plane, a first signal line over the one or more dielectric layers, wherein the first signal line and the first ground conductor and the second ground conductor are substantially parallel, and a second signal line over the one or more dielectric layers, wherein the second signal line and the first ground conductor and the second ground conductor are substantially parallel, and wherein the second signal line is substantially parallel to the first signal line.

In accordance with yet another aspect of the present invention, a method of forming a coupled microstrip line structure, the method comprising providing a semiconductor substrate, forming a first ground plane over the semiconductor substrate, wherein the first ground plane comprises a plurality of first ground strip shields substantially parallel to each other, and forming a first ground conductor and a second ground conductor electrically coupled to the plurality of first ground strip shields, wherein the first and second ground conductors are substantially parallel to each other. The method further comprises forming one or more dielectric layers over the first ground plane, and forming a plurality of signal lines over the one or more dielectric layers.

The advantageous features of the present invention include adjustable characteristic impedances and adjustable characteristic wavelengths of coupled microstrip lines. The chip area required by the coupled microstrip line embodiments of the present invention is also reduced over conventional coupled microstrip lines.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently illustrated embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Novel coupled microstrip lines having tunable characteristic impedances and tunable characteristic wavelengths are provided. The variations of the illustrated embodiments are then discussed. Throughout the various views and illustrative embodiments of the present invention, like reference numbers are used to designate like elements.

Figure 1A:
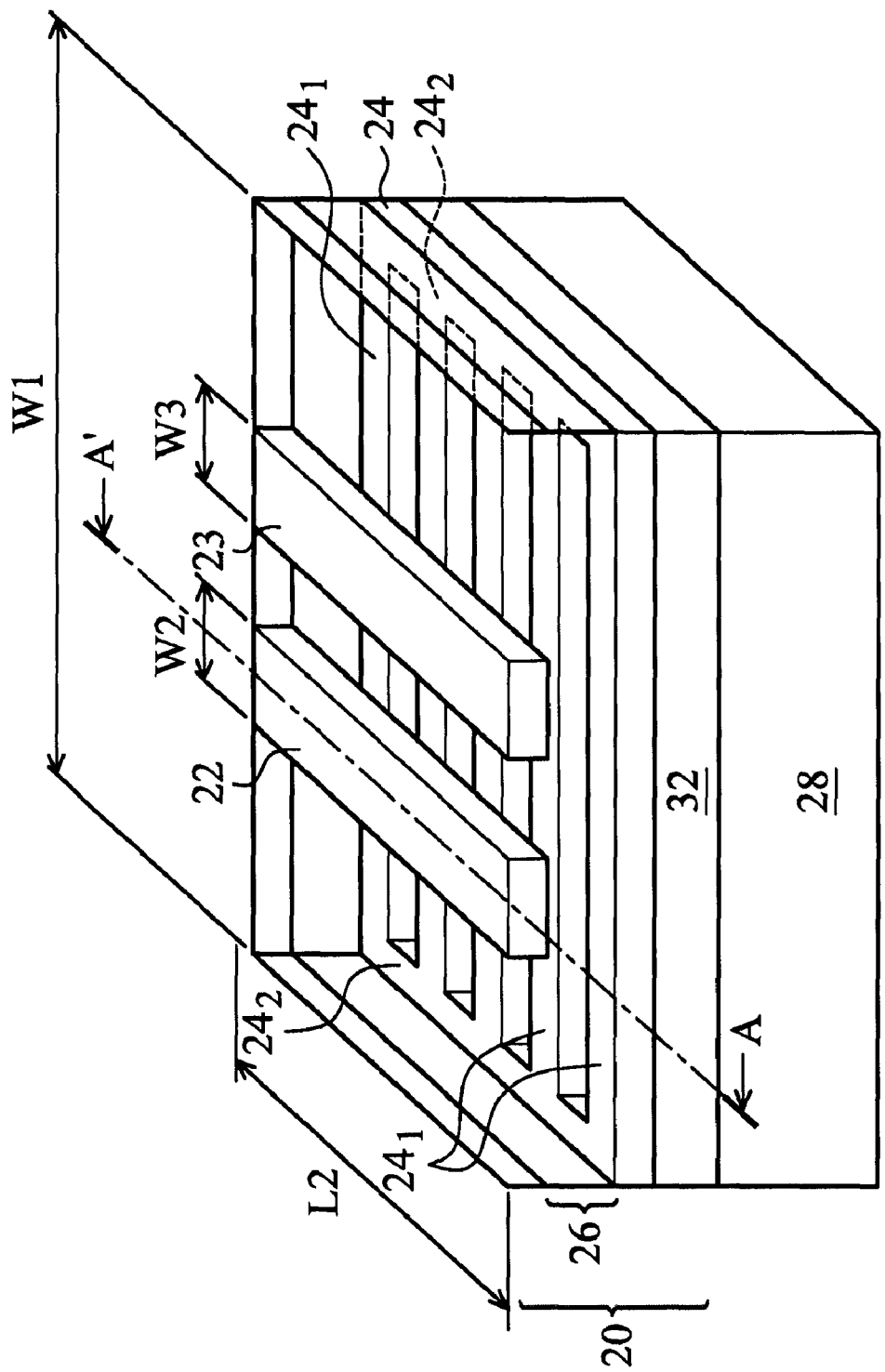
FIG. 1A illustrates a perspective view of an embodiment of the present invention, wherein coupled microstrip lines include a ground plane.
Figure 1B:
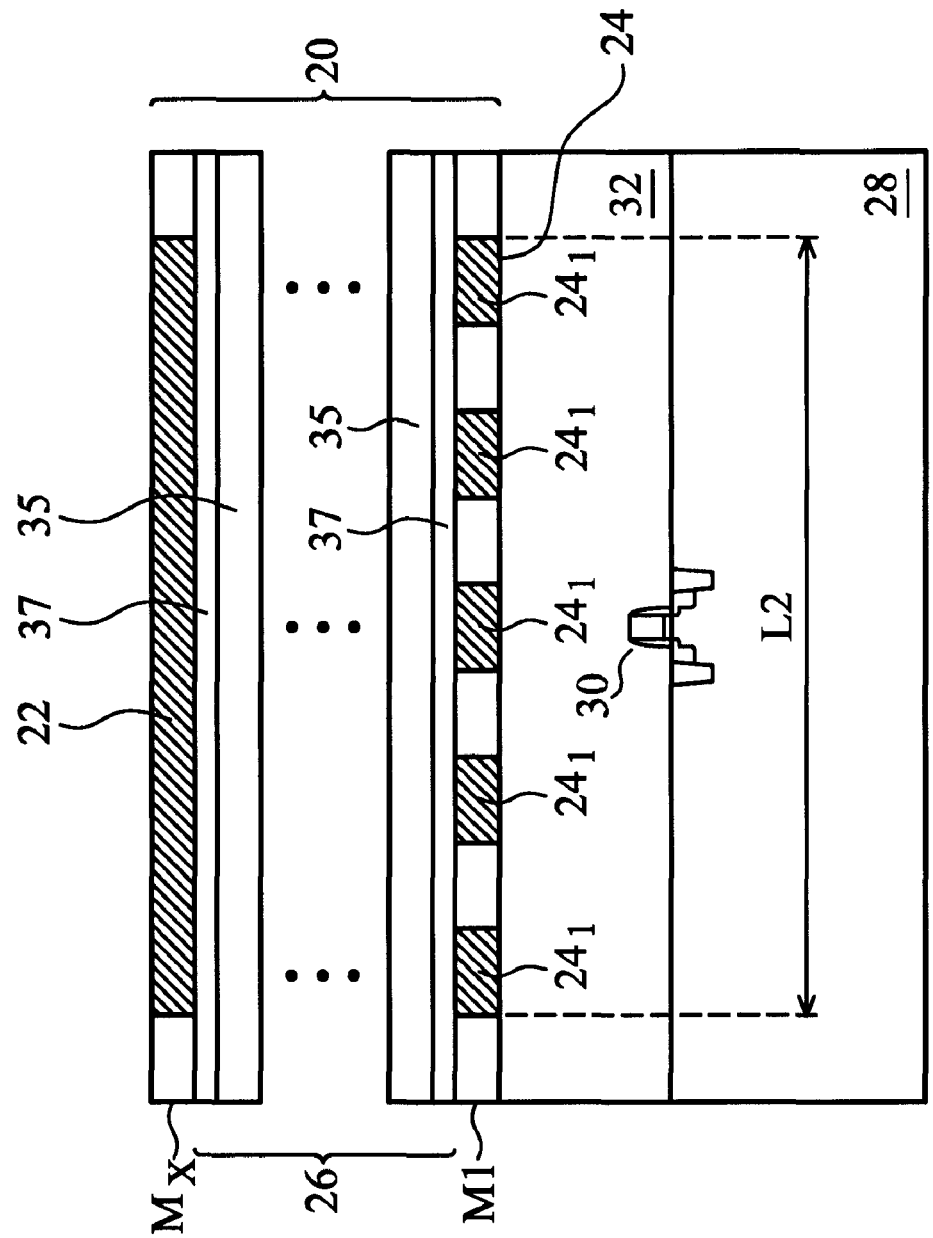
FIG. 1B illustrates a cross-sectional view of the structure of FIG. 1A.
Figure 1C:
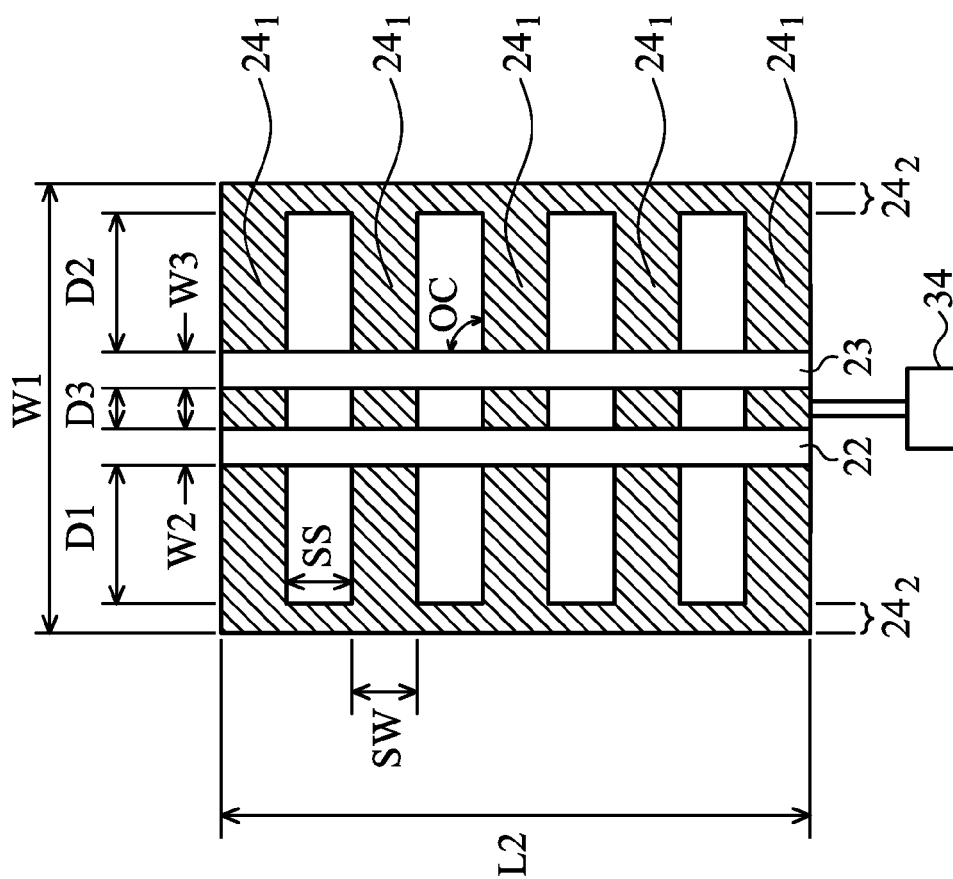
FIG. 1C illustrates a top view of the coupled microstrip line structure of FIG. 1A.

FIGS. 1A, 1B, and 1C illustrate a perspective view, a side view, and a top view, respectively, in accordance with an embodiment of the present invention, wherein the side view of FIG. 1B is a cross section taken along the A-A' line of FIG. 1A. As shown in FIG. 1A, represents a coupled microstrip line 20 is denoted by a bracket and includes first signal line 22, second signal line 23, ground plane 24, one or more dielectric layers 26, and an inter-layer dielectric (ILD) layer 32, all formed over substrate 28. In an embodiment, the substrate 28 is a semiconductor substrate, and may include commonly used semiconductor materials such as silicon, germanium, and the like. It should be noted that the figures illustrated herein represent only a portion of a semiconductor chip, and that other regions of the semiconductor chip may include other regions having no coupled microstrip line(s) formed thereon.

As shown in FIG. 1A, the ground plane 24 may have a rectangular parameter, with length L2 (in the lengthwise direction of the first signal line 22 and the second signal line 23, which is the direction signals propagate) and width W1. The first signal line 22 and the second signal line 23 have a smaller width W2 and W3, respectively, than the width W1 of the ground plane 24. In an illustrative embodiment, width W2 of first signal line 22 and width W3 of second signal line 23 are equal. While the ground plane 24 is rectangular in the illustrative embodiment, the ground plane 24 may have any suitable shape. In an embodiment, the ground plane 24 comprises ground strip shields $24_1$ and ground conductors $24_2$. The ground strip shields $24_1$ are perpendicular to the lengthwise direction of the first signal line 22 and the second signal line 23, with the angle α between the respective signal lines (e.g., first signal line 22 and second signal line 23), and the ground strip shields $24_1$ being about 90 degrees (shown in FIG. 1C). Alternatively, angle α may have other non-zero values, as shown in FIG. 1C. The ground conductors $24_2$ are end portions of the ground plane 24 that allow propagation of a return signal and, in the illustrated embodiment, interconnect to the ground strip shields $24_1$ at their terminus. In the illustrated embodiment, the ground conductors $24_2$ are substantially parallel to the first signal line 22 and the second signal line 23.

Generally, the ground plane 24 is formed with a damascene process wherein the ILD layer 32 is patterned and etched such that at least one or more trenches are formed in the ILD layer 32. The trenches are then filled, by any suitable method, with a conductive material, creating a plurality of conductive strips (ground strip shields $24_1$) that are separated by a dielectric material. As described above, the ground strip shields $24_1$ are formed such that they are substantially parallel and electrically coupled together by the ground conductors $24_2$. In another embodiment, the ground plane 24 is formed with an etching process wherein a conductive layer is formed over the ILD layer 32. The conductive layer is then patterned and etched such that a plurality of conductive strips (ground strip shields $24_1$) are formed. In the illustrated embodiment, the conductive layer is patterned and etched such that each ground strip shields $24_1$ is substantially parallel to the adjacent ground strip shields $24_1$, and electrically coupled together by the ground conductors $24_2$.

In the embodiment illustrated by FIG. 1B, the ground plane 24, as the name suggests, is grounded. In an illustrative embodiment, the ground plane 24 is formed in a lower metallization layer, such as metallization layer M1, typically referred to as metallization layer 1, which is also the bottom metallization layer), metallization layer M2 (not shown, but typically referred to as metallization layer 2), or the like. Accordingly, the ground plane 24 may be formed over the ILD layer 32, wherein integrated circuits 30 may be underlying the ILD 32. Integrated circuits, (e.g., the integrated circuit 30 illustrated in FIG. 1B), such as complementary metal-oxide-semiconductor (CMOS) devices, may be formed at the surface of the substrate 28. The integrated circuits 30 are symbolized by a MOS device for illustrative purposes only and may include other circuits. Alternatively, the ground plane 24 may be formed under the ILD 32, and may be formed of doped polysilicon or metals. In this case, the ground plane 24 may be formed simultaneously with the gates of the CMOS devices in the integrated circuit 30.

The first signal line 22 is formed in an upper metallization layer $M_x$. In the illustrated embodiment, the first signal line 22 is formed in the top metallization layer, but in other embodiments, the first signal line 22 is formed in a metallization layer underlying the top metallization layer, such as metallization layer 2 through the uppermost metallization layer. In yet other embodiments, the first signal line 22 may be formed over the top metallization layer and may be formed of a conductive material, such as a conductive metal, metal alloys, or doped poly-silicon. Generally, the first signal line 22 and the ground plane 24 may be formed in any metallization layer as long as one or more dielectric layers 26 separate the first signal line 22 and the ground plane 24. The formation methods of the first signal line 22 and the ground plane 24 include commonly known damascene and/or deposition/etch processes.

The dielectric layer 26, as shown in FIG. 1B, may include inter-metal dielectric (IMD) layers 35, etch stop layers 37, which are between the IMDs 35, and the like. The dielectric layer 26 may thus include low-k dielectric materials, for example, with dielectric constants lower than about 3.0, or even about 2.5 or lower. In the illustrated embodiments, no conductive features are formed in the region vertically between the first signal line 22 and the ground plane 24, or directly over the ground plane 24. In the case that the first signal line 22 is formed over the top metallization layer, the dielectric layers 26 may further include one or more passivation layers. The cross sectional view through the second signal line 23 is substantially similar to the cross sectional depiction shown through the first signal line 22 of FIG. 1B and described above.

As shown in the illustrated embodiment of FIG. 1C, the number of the ground strip shields $24_1$ are greater than about 2, and in other embodiments greater than about 4, with a dielectric material interposed between adjacent ground strip shields $24_1$. In the illustrated embodiment, the ground strip shields $24_1$ are arranged in a periodic pattern. For example, the spacing SS between each neighboring ground strip shield $24_1$ may be equal. In alternative embodiments, the spacing SS between two neighboring ground strip shields $24_1$ may be different from the spacing SS between two other adjacent ground strip shields $24_1$. The spacings SS may also be arranged in an order from smaller to greater (for example, forming an arithmetic sequence or a geometric sequence), with each spacing SS being greater than a previous one.

To effectively shield the substrate 28 (FIGS. 1A & 1B) from the signal carried in the first signal line 22 and the second signal line 23, the ratio of the total area of the ground strip shields $24_1$ to the total area of the dielectric material in the illustrated embodiments is greater than about 0.1 to about 0.3 and in other embodiments, greater than about 0.05 to about 0.5. The width SW of each ground strip shield $24_1$, and the spacing SS between adjacent ground strip shields $24_1$, may affect the performance of the characteristic impedance and the characteristic wavelength of the resulting coupled microstrip line 20 and each may be adjusted for a particular application.

In an embodiment, the first signal line 22 and the second signal line 23 are separated by horizontal distance D3, such that the first signal line 22 and the second signal line 23 form coupled signal lines. Additionally, the horizontal distance D1 between one ground conductor $24_2$ and the first signal line 22 is equal to horizontal distance D2 between a different ground conductor $24_2$ and the second signal line 23, although distances D1 and D2 may be different from each other. As illustrated, the coupled signal lines 22 and 23 connect to a microwave device 34.

In coupled microstrip line structures having a solid ground plane, an inductance return path is in the solid ground plane at a position directly underlying the signal lines, thus limiting the characteristic impedance of the microstrip line. Advantageously, in the embodiments of the present invention, the ground strip shields $24_1$ direct the inductance return path to the ground conductors $24_2$, which are spaced apart from the coupled signal lines 22 and 23. By forcing the inductance return path to the ground conductors $24_2$, the electric and magnetic fields generated by the signal are spatially separated from the substrate, resulting in an increase in inductance. Accordingly, the characteristic impedance and characteristic wavelength may be tuned by adjusting the distance between the ground conductors $24_2$ and the coupled signal lines 22 and 23. The adjustment may be implemented by adjusting the length W1 (hence distances D1 and D2) of the ground plane 24. Advantageously, the spatial separation caused by the ground strip shields $24_1$ and the ground conductors $24_2$ also results in a slow-wave feature. The slow-wave feature of the microstrip lines of the present invention allows for a higher quality factor than other transmission lines.

Figure 2:
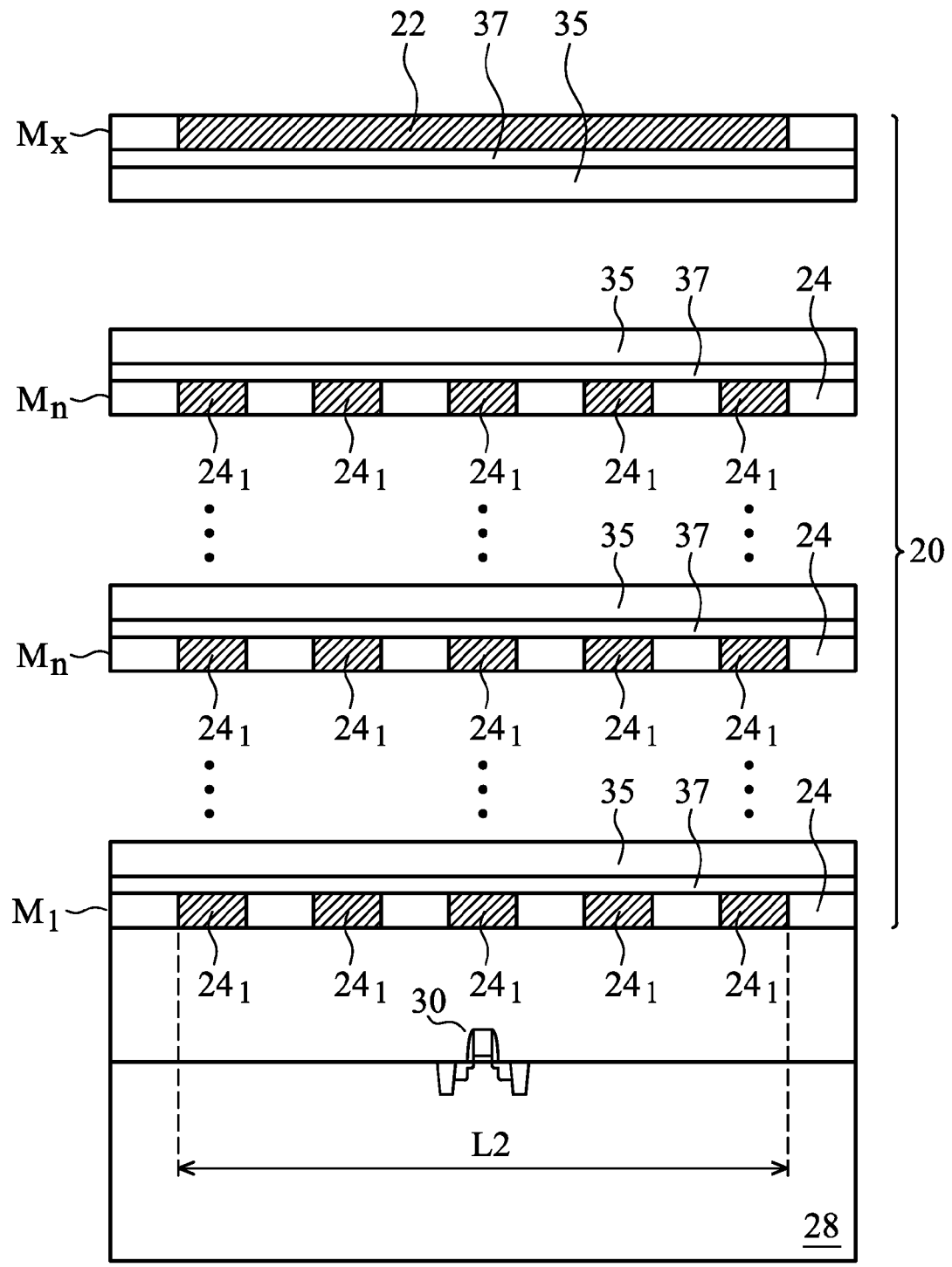
FIG. 2 illustrates a cross sectional view of an alternative embodiment of the present invention, wherein the coupled microstrip line structure includes multiple ground planes.

In a cross sectional view of another embodiment illustrated in FIG. 2, multiple ground planes 24 are utilized, each located in a metallization layers $M_n$. The layers of the ground plane 24 are interconnected by periodically located via columns. In other embodiments, the via columns/via strips connecting different layers of the ground plane 24 form solid strips vertically overlapping, and possibly co-terminus with, the overlying and underlying ground strip shields $24_1$.

Figure 3:
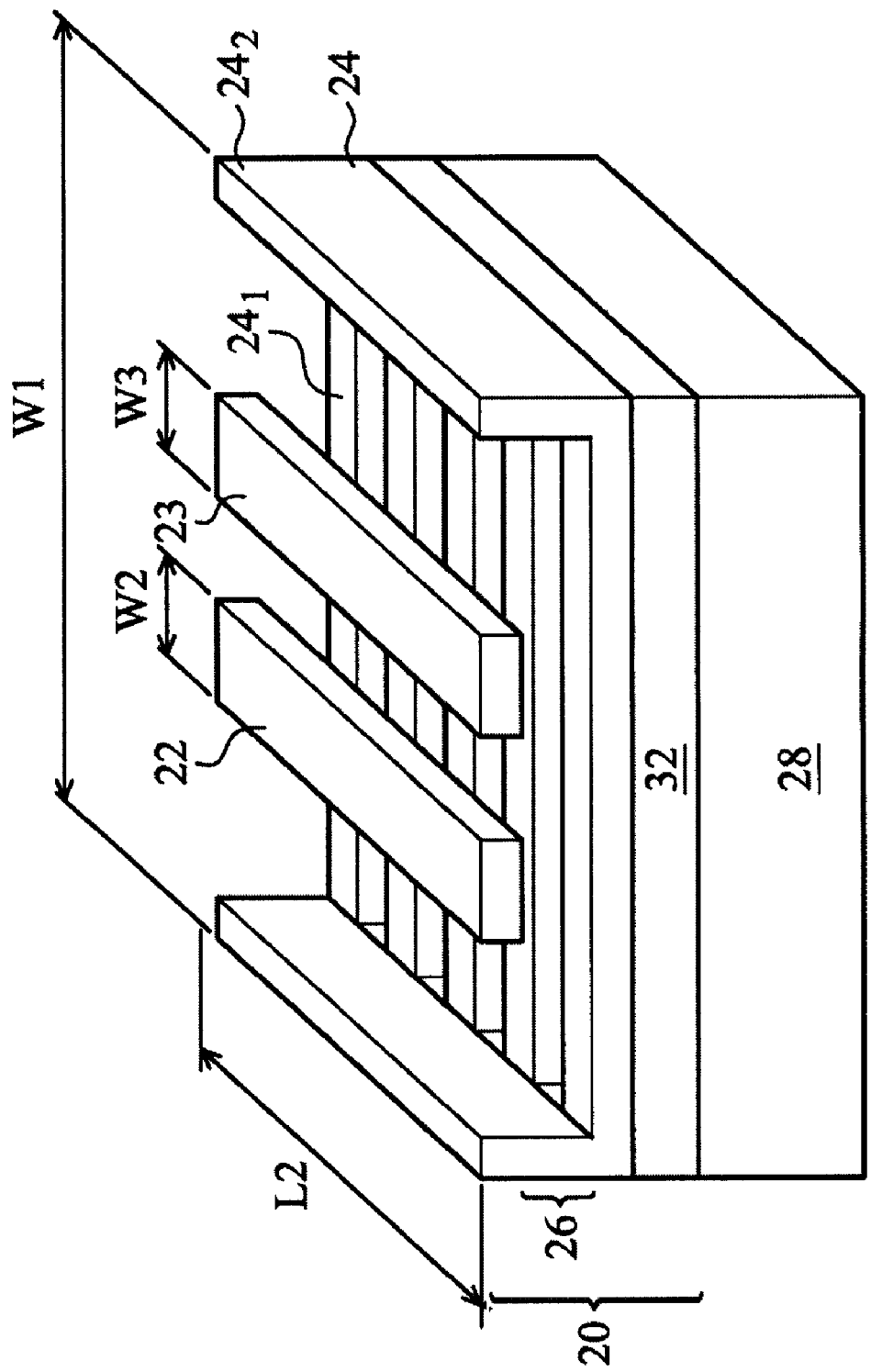
FIG. 3 illustrates a perspective view of an alternative embodiment of the present invention, wherein coupled microstrip lines include a ground plane and ground conductors.

FIG. 3 illustrates a perspective view of another embodiment of the present invention. In this embodiment, the ground conductors $24_2$ extend upward toward the top metallization layer beyond the metallization layer in which the ground plane 24 is located. As shown in FIG. 3, the top surfaces of the ground conductors $24_2$ are level with the top surfaces of the first signal line 22 and the second signal line 23. In other embodiments, the top surface of the ground conductors $24_2$ may extend over, or lower than, the top surface of the first signal line 22 and the second signal line 23.

Figure 4:
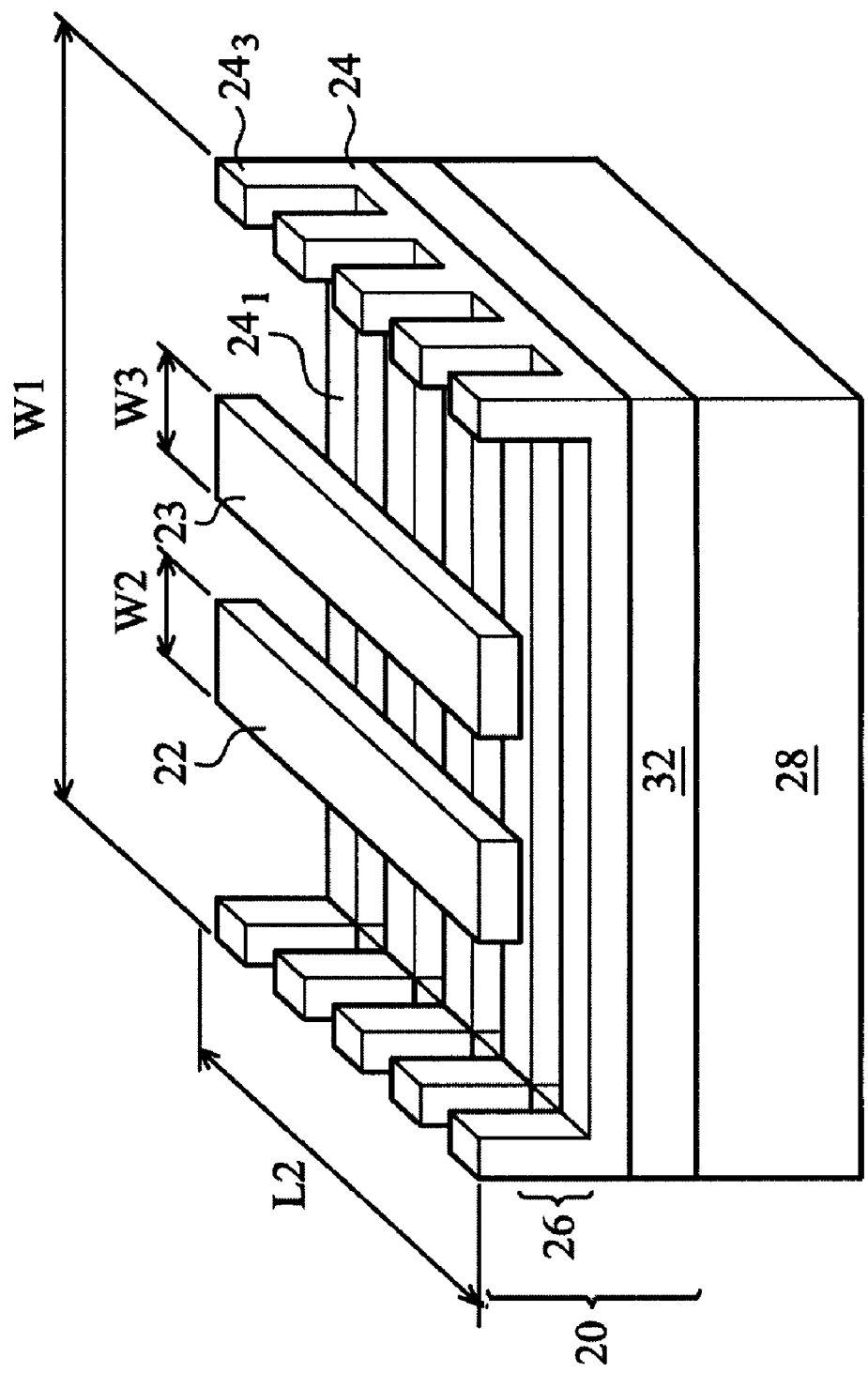
FIG. 4 illustrates an alternative embodiment of the present invention, wherein ground conductors of the ground plane comprise ground conductor strips.

FIG. 4 illustrates yet another embodiment of the present invention. In this embodiment, the solid ground conductors $24_2$ of FIG. 3 are replaced with ground conductor strips $24_3$ extending upward beyond the metallization layer in which the ground strip shields $24_1$ are located. In the illustrated embodiment, the ground conductor strips $24_3$ are electrically coupled to adjacent ground conductor strips. The ground conductor strips $24_3$ are of a width equal to the adjacent ground strip shield $24_1$ of ground strip shield 24, although the widths may vary. In the illustrated embodiment as shown in FIG. 4, the top surfaces of the ground conductors $24_3$ are level with the top surfaces of the first signal line 22 and the second signal line 23. In other embodiments, the top surface of the ground conductors $24_3$ may extend over, or lower than, the top surface of the first signal line 22 and the second signal line 23.

Figure 5:
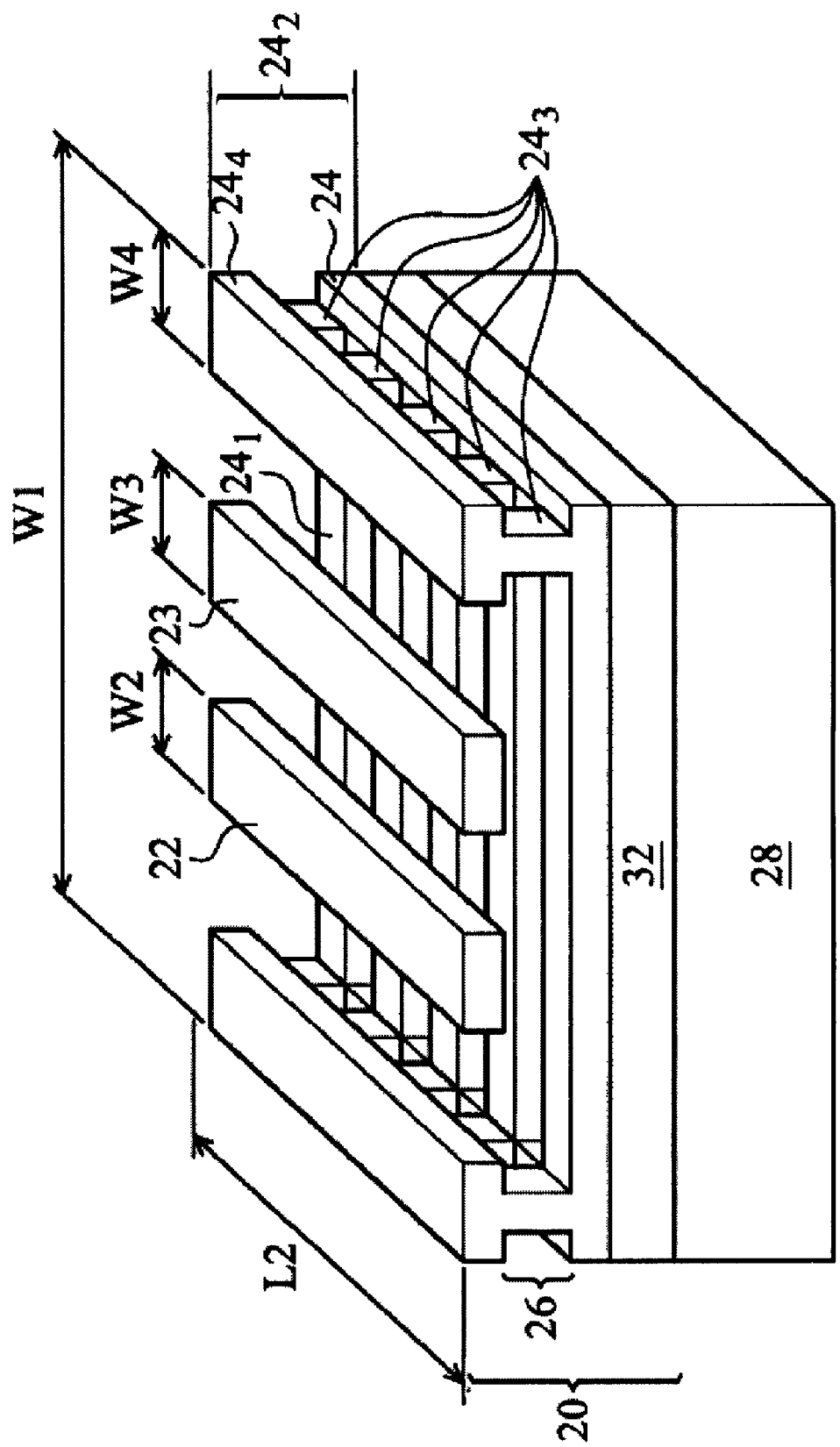
FIG. 5 illustrates an alternative embodiment of the present invention, wherein ground conductors of the ground plane have width equal to the width of the signal lines.

FIG. 5 illustrates yet another embodiment of the present invention. In this embodiment, the ground conductor strips $24_3$ of FIG. 4 are joined by an upper ground conductor $24_4$. Upper ground conductor $24_4$ resides within the metallization layer occupied by the first signal line 22 and the second signal line 23, and the upper ground conductors $24_4$ have geometry similar to that of first signal line 22 and second signal line 23 although other geometries are contemplated. For example, the width W4 of the upper ground conductors $24_4$ is equal to the width W2 of the first signal line 22 and the width W3 of the second signal line 23. In other embodiments, the upper ground conductors $24_4$ have width W4 not equal to width W2 and W3. In the illustrated embodiment as shown in FIG. 5, the top surfaces of the upper ground conductors $24_4$ are level with the top surfaces of the first signal line 22 and the second signal line 23. In other embodiments, the top surface of the upper ground conductors $24_4$ may extend over, or lower than, the top surface of the first signal line 22 and the second signal line 23. Additionally, ground conductors strips $24_3$ may be moved away from the edge of the ground plane 24 such that each ground conductor strip $24_3$ resides on the terminus of an associated ground strip shield $24_1$ as shown in FIG. 5.

Figure 6:
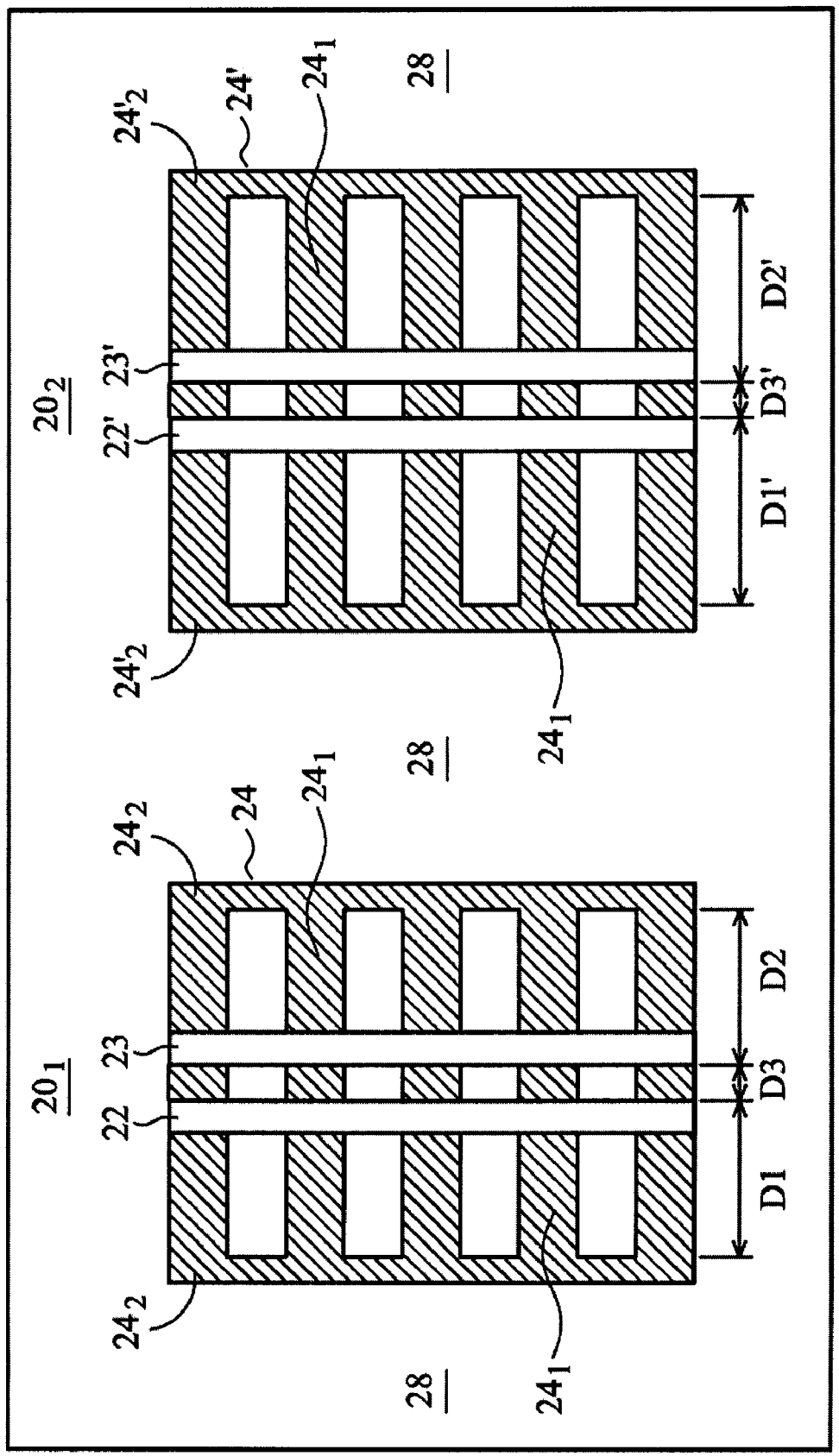
FIG. 6 illustrates two coupled microstrip line structures having different characteristic impedances and wavelengths.

It is realized that in one semiconductor chip, coupled microstrip lines having different characteristic impedances and wavelengths may be needed. The embodiments of the present invention can easily satisfy such a requirement. In an embodiment of the present invention, as shown in FIG. 6, the coupled microstrip line $20_1$ and the coupled microstrip line $20_2$ are formed on the same substrate 28. Each of the coupled microstrip line $20_1$ and the coupled microstrip line $20_2$ has a similar structure as shown in FIG. 1A. The horizontal distance D1 between the first signal line 22 and a ground conductor $24_2$ and the horizontal distance D2 between the second signal line 23 and a different ground conductor $24_2$ may be different from the horizontal distance D1' between the first signal line 22' and a ground conductor $24_2$' and the horizontal distance D2' between the second signal line 23' and a different ground conductor $24_2$'. In addition, the horizontal distance D3 between the first signal line 22 and the second signal line 23 may be different from the horizontal distance D3' between the first signal line 22' and the second signal line 23'. Accordingly, the characteristic impedance and the characteristic wavelength of the coupled microstrip line $20_1$ may be different from that of the coupled microstrip line $20_2$. Although not apparent because of the perspective of FIG. 6, the vertical distances between the first signal lines 22 and 22', the second signal lines 23 and 23' and the respective underlying ground planes 24 and 24' may also be different. In the case that the coupled microstrip lines $20_1$ and $20_2$ are impedance matching devices, different characteristic impedances can be achieved by adopting different distances D1/D2 and D1'/D2'. If needed, more coupled microstrip lines having different characteristic impedances and different characteristic wavelengths can be added.

The embodiments of the present invention have several advantageous features. Firstly, the characteristic impedance and characteristic wavelength may be tuned, and are not limited by the vertical distance between the signal lines and the underlying ground plane. Secondly, coupled microstrip lines with greater characteristic impedances may be achieved without increasing the chip area of the coupled microstrip lines. Thirdly, coupled microstrip lines may have smaller characteristic wavelengths, resulting in shorter coupled microstrip lines, which allow further reduction in the chip area usage. Fourthly, the formation of the embodiments of the present invention do not need additional mask, and hence manufacturing cost is not increased. Fifthly, coupled microstrip lines of the present invention may be used in RF circuits to extend coupled microstrip lines used in RF circuit design mixers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A coupled microstrip line structure comprising:
a first ground plane having a plurality of first ground strip shields separated by a dielectric material, each of the first ground strip shields having a first width as measured in a first direction;
a first dielectric layer over the first ground plane;
a first signal line over the first dielectric layer, wherein the first signal line is directly above the plurality of first ground strip shields, and wherein the first signal line and the plurality of first ground strip shields are non-parallel;
a second signal line over the first dielectric layer, wherein the second signal line is directly above the plurality of first ground strip shields, and wherein the second signal line and the plurality of first ground strip shields are non-parallel, and wherein the second signal line is substantially parallel to the first signal line;
a second ground plane having a plurality of second ground strip shields, the second ground plane interposed between the first ground plane and the first and second signal lines;
wherein the first ground plane further comprises first ground conductors extending substantially in the first direction and parallel to the first signal line and the second signal line, wherein the first ground conductors electrically couple the plurality of first ground strip shields; and
first ground conductor extensions electrically coupled to and continuously contacting respective top surfaces of the first ground conductors along the first direction, the first ground conductor extensions having a second width at least as wide as the first width as measured in the first direction.

2. The coupled microstrip line structure of claim 1, further comprising:
a second dielectric layer over the second ground plane, the second dielectric layer interposed between the second ground plane and the first and second signal lines;
wherein the second ground plane further comprises second ground conductors substantially parallel to the first signal line and the second signal line, wherein the second ground conductors electrically couple the plurality of second ground strip shields.

3. The coupled microstrip line structure of claim 1, wherein the first ground conductor extensions continuously contact the entirety of the respective top surfaces of the first ground conductors.

4. The coupled microstrip line structure of claim 1, wherein the first ground conductor extensions further comprise a plurality of ground conductor strips each being aligned with a respective one of the plurality of first ground strip shields and having a third width equal to the first width as measured in the first direction, wherein the plurality of ground conductor strips extend through the first dielectric layer, and are separated by a dielectric material.

5. The coupled microstrip line structure of claim 4, wherein the plurality of ground conductors strips forming each first ground conductor extensions are joined by an upper ground conductor.

6. The coupled microstrip line structure of claim 1, wherein the first dielectric layer comprises a plurality of inter-metal dielectric (IMD) layers.

7. The coupled microstrip line structure of claim 1, wherein the first ground strip shields are substantially perpendicular to the first signal line and the second signal line.

8. A coupled microstrip line structure comprising:
a substrate;
a first ground plane over the substrate, wherein the first ground plane is conductive and comprises a plurality of first ground strip shields substantially parallel to each other, each of the first ground strip shields having a first width as measured in a first direction;
a first ground conductor and a second ground conductor electrically coupled to the plurality of first ground strip shields, wherein the first and second ground conductors are substantially parallel to each other;
one or more dielectric layers over the first ground plane;
a first signal line over the one or more dielectric layers, wherein the first signal line and the first ground conductor and the second ground conductor are substantially parallel;
a second signal line over the one or more dielectric layers, wherein the second signal line and the first ground conductor and the second ground conductor are substantially parallel, and wherein the second signal line is substantially parallel to the first signal line;
a second ground plane over the substrate, wherein the second ground plane is conductive and comprises a plurality of second ground strip shields extending substantially parallel to each other and substantially across a width of the second ground plane; and
first and second ground conductor extensions electrically coupled to and continuously contacting respective top surfaces of the first and second ground conductors along the first direction, the first and second ground conductor extensions having a second width at least as wide as the first width as measured in the first direction.

9. The coupled microstrip line structure of claim 8, further comprising:
a third ground conductor and a fourth ground conductor electrically coupled to the plurality of second ground strip shields, wherein the third and fourth ground conductors are substantially parallel to each other.

10. The coupled microstrip line structure of claim 8, further comprising a plurality of metallization layers over the substrate, wherein the first signal line and the second signal line are in a top metallization layer of the plurality of metallization layers, and wherein the first ground plane is in a bottom metallization layer of the plurality of metallization layers.

11. The coupled microstrip line structure of claim 8, wherein the first and second ground conductor extensions continuously contact the entirety of the respective top surfaces of the first and second ground conductors.

12. The coupled microstrip line structure of claim 8, wherein the first and second ground conductor extensions further comprise a plurality of ground conductor strips each being aligned with a respective one of the plurality of first ground strip shields and having a third width equal to the first width as measured in the first direction, wherein the plurality of ground conductor strips extend through the one or more dielectric layers, and are separated by a dielectric material.

13. The coupled microstrip line structure of claim 12, wherein the plurality of ground conductor strips forming the first ground conductor extension are joined by a first upper ground conductor, and the plurality of ground conductor strips forming the second ground conductor extension are joined by a second upper ground conductor.

14. The coupled microstrip line structure of claim 8, wherein a portion of the one or more dielectric layers directly overlying the first ground plane is free from conductive features.

15. A method of forming a coupled microstrip line structure, the method comprising:
providing a semiconductor substrate;
forming a first ground plane over the semiconductor substrate, wherein the first ground plane comprises a plurality of first ground strip shields substantially parallel to each other, each of the first ground strip shields having a first width as measured in a first direction;
forming a first ground conductor and a second ground conductor electrically coupled to the plurality of first ground strip shields, wherein the first and second ground conductors are substantially parallel to each other;
forming one or more dielectric layers over the first ground plane;
forming a plurality of signal lines over the one or more dielectric layers; and
forming a second ground plane interposed between the first ground plane and the plurality of signal lines, wherein the second ground plane comprises a plurality of second ground strip shields extending substantially parallel to each other and substantially across a width of the second ground plane;
wherein the forming the first ground conductor and the second ground conductor comprises forming first and second portions extending from the first and second ground conductors into the one or more dielectric layers overlying the first ground plane, the first and second portions continuously contacting respective top surfaces of the first and second ground conductors along the first direction and having a second width at least as wide as the first width as measured in the first direction.

16. The method of claim 15, wherein the one or more dielectric layers are interposed between the first ground plane and the second ground plane and between the second ground plane and the plurality of signal lines.

17. The method of claim 15, wherein the forming the first ground conductor and the second ground conductor comprises forming the first and second ground conductors such that the first and second ground conductors are substantially equally spaced from the plurality of signal lines.

18. The method of claim 15, wherein the forming the first ground conductor and the second ground conductor comprises forming the first and second portions such that they continuously contact the entirety of the respective top surfaces of the first and second ground conductors.

19. The method of claim 15, wherein the forming the first ground conductor and the second ground conductor further comprises forming the first and second ground conductors such that the first and second portions comprise a plurality of conductive strips separated by a dielectric material, wherein each conductive strip is aligned with a respective one of the plurality of first ground strip shields and has a third width equal to the first width as measured in the first direction.

* * * * *